(12) United States Patent
Hollingsworth et al.

(10) Patent No.: US 12,368,029 B2
(45) Date of Patent: Jul. 22, 2025

(54) LAMELLAR CERAMIC STRUCTURE

(71) Applicant: Lam Research Corporation, Fremont, CA (US)

(72) Inventors: Joel Philip Hollingsworth, Portland, OR (US); Karl Frederick Leeser, West Linn, OR (US); Ramkishan Rao Lingampalli, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 132 days.

(21) Appl. No.: 17/438,354

(22) PCT Filed: Mar. 12, 2020

(86) PCT No.: PCT/US2020/022495
§ 371 (c)(1),
(2) Date: Sep. 10, 2021

(87) PCT Pub. No.: WO2020/186120
PCT Pub. Date: Sep. 17, 2020

(65) Prior Publication Data
US 2022/0181126 A1 Jun. 9, 2022

Related U.S. Application Data

(60) Provisional application No. 62/818,591, filed on Mar. 14, 2019.

(51) Int. Cl.
H01J 37/32 (2006.01)
H01L 21/687 (2006.01)

(52) U.S. Cl.
CPC ........... H01J 37/32724 (2013.01); H01J 37/32082 (2013.01); H01L 21/68757 (2013.01); H01L 21/68785 (2013.01); H01J 2237/3321 (2013.01)

(58) Field of Classification Search
CPC ........... H01J 37/32724; H01J 37/32082; H01J 2237/3321; H01L 21/68757; H01L 21/68785
(Continued)

(56) References Cited

U.S. PATENT DOCUMENTS 4,766,097 A * 8/1988 Shinozaki ............. C04B 35/581
264/681
6,267,839 B1 7/2001 Shamouilian et al.
(Continued)

FOREIGN PATENT DOCUMENTS

CN 107735386 2/2018
CN 113574653 4/2025
(Continued)

OTHER PUBLICATIONS

"International Application Serial No. PCT US2020 022495, International Preliminary Report on Patentability mailed Sep. 23, 2021", 7 pages.
International Application Serial No. PCT/US2020/022495, Written Opinion mailed Jul. 2, 2020, 5 pgs.
Taiwan Application Serial No. 109108380, Office Action mailed Jul. 24, 2023, w/ English translation, 20 pgs.
(Continued)

Primary Examiner — Charlee J. C. Bennett
(74) Attorney, Agent, or Firm — Schwegman Lundberg & Woessner, P.A.

(57) ABSTRACT

In some examples, a substrate support assembly comprises a monolithic ceramic body, a heater element disposed within the monolithic ceramic body, and an RF antenna disposed within the monolithic ceramic body. One or more power lines supplies the heater element and the RF antenna. A lamellar structure is formed or included within the monolithic ceramic body, the lamellar structure including at least one layer having a thermal conductivity different than a thermal conductivity of the monolithic ceramic body.

21 Claims, 4 Drawing Sheets

(58) Field of Classification Search
USPC .......................................................... 118/725
See application file for complete search history.

(56) References Cited

U.S. PATENT DOCUMENTS

| | | | |
|---|---|---|---|
| 6,294,771 | B2 | 9/2001 | Katsuda et al. |
| 7,375,046 | B2 * | 5/2008 | Aihara .................. C04B 35/505 501/97.4 |
| 7,929,269 | B2 * | 4/2011 | Rusinko, Jr. .......... H01L 21/683 361/230 |
| 2001/0006172 | A1 * | 7/2001 | Katsuda ................. H05B 3/283 219/544 |
| 2006/0076109 | A1 * | 4/2006 | Holland ............ H01L 21/67248 118/724 |
| 2006/0199722 | A1 | 9/2006 | Aihara et al. |
| 2008/0066676 | A1 * | 3/2008 | Mariner ............ H01L 21/68785 118/724 |
| 2014/0209242 | A1 * | 7/2014 | Sun .................... H01L 21/67103 156/345.37 |
| 2016/0035610 | A1 * | 2/2016 | Park .................... H01L 21/6833 165/80.2 |
| 2017/0072516 | A1 | 3/2017 | Elliot et al. |
| 2017/0167790 | A1 * | 6/2017 | Gaff ...................... H05B 3/0014 |
| 2018/0269097 | A1 * | 9/2018 | Maeta ................. H01L 21/6831 |
| 2018/0350610 | A1 * | 12/2018 | Lingampalli ..... H01L 21/28556 |
| 2018/0374735 | A1 * | 12/2018 | Fujita .................... H02N 13/00 |
| 2020/0176282 | A1 * | 6/2020 | Iijima ............... H01L 21/68757 |

FOREIGN PATENT DOCUMENTS

| | | |
|---|---|---|
| JP | H0656596 | 3/1994 |
| JP | H07273164 | 10/1995 |
| JP | H11260534 | 9/1999 |
| JP | 2007265998 | 10/2007 |
| JP | 2011525719 | 9/2011 |
| JP | 2015529969 | 10/2015 |
| JP | 2017147312 A | 8/2017 |
| JP | 2017527115 | 9/2017 |
| JP | 2022525595 A | 5/2022 |
| JP | 2025041897 | 3/2025 |
| WO | 2010008827 | 1/2010 |
| WO | 2014014646 | 1/2014 |
| WO | 2015198942 | 12/2015 |
| WO | 2016025573 | 2/2016 |

OTHER PUBLICATIONS

Taiwanese Application Serial No. 109108380, Response filed Oct. 19, 2023 to Office Action mailed Jul. 24, 2023, w/ English translation of amendments, 22 pgs.
International Application Serial No. PCT/US2020/022495, International Search Report mailed Jul. 2, 2020, 3 pgs.
International Application Serial No. PCT/US2020/022495, Written Opinion mailed Jul. 2, 20, 5 pgs.
"Japanese Application Serial No. 2021-555175, Notification of Reasons for Refusal mailed Feb. 20, 2024", w English Translation, 8 pgs.
"Taiwanese Application Serial No. 109108380, Office Action mailed Feb. 22, 2024", w Machine English Translation, 18 pgs.
"Chinese Application Serial No. 202080021055.4, Response filed Oct. 11, 2024 to Office Action mailed Jun. 11, 2024", wEnglish claims, 3 pgs.
Chinese Application Serial No. 202080021055.4, Office Action mailed Jun. 11, 2024, 15 pgs.
Japanese Application Serial No. 2021-555175, Examiners Decision of Final Refusal mailed Aug. 27, 2024, 5 pgs.
Japanese Application Serial No. 2021-555175, Response filed May 16, 2024 to Notification of Reasons for Refusal mailed Feb. 20, 2024, 12 pgs.
Korean Application Serial No. 10-2021-7033054, Notice of Preliminary Rejection mailed May 22, 2024, 15 pgs.
Korean Application Serial No. 10-2021-7033054, Response filed Jul. 22, 2024 to Notice of Preliminary Rejection mailed May 22, 2024, 35 pgs.
Japanese Application Serial No. 2024-229581, Voluntary Amendment filed Jan. 21, 2025, W/Machine English translation, 22 pgs.
Korean Application Serial No. 10-2021-7033054, Notice of Preliminary Rejection mailed Jan. 28, 2025, w/ Machine English translation, 15 pgs.
"Taiwanese Application Serial No. 109108380, Office Action mailed Nov. 26, 2024", w English translation, 8 pgs.
"Japanese Application Serial No. 2021-555175, Response filed Dec. 26, 2024 to Examiners Decision of Final Refusal mailed Aug. 27, 2024", w English claims, 13 pgs.
"Korean Application Serial No. 10-2021-7033054, Response filed Mar. 28, 2025 to Notice of Preliminary Rejection mailed Jan. 28, 2025", W English Claims, 35 pgs.
"Taiwanese Application Serial No. 109108380, Response filed Feb. 25, 2025 to Decision of Rejection mailed Jan. 31, 2024", w English claims (not amended), 3 pgs.

* cited by examiner

LAMELLAR CERAMIC STRUCTURE

CLAIM OF PRIORITY

This patent application is a U.S. National Stage Filing under 35 U.S.C. 371 from International Application No. PCT/US2020/022495, filed on Mar. 12, 2020, and published as WO 2020/186120 A1 on Sep. 17, 2020, which claims the benefit of priority to Hollingsworth et al, U.S. Provisional Patent Application Ser. No. 62/818,591, entitled "Lamellar Ceramic Structure," filed on Mar. 14, 2019, each of which is hereby incorporated by reference herein in its entirety.

FIELD

The present disclosure relates generally to lamellar ceramic structures, and in particular to a substrate support assembly including a lamellar ceramic structure for a wafer processing chamber in semiconductor manufacturing operations.

BACKGROUND

The background description provided here is for generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Ceramic pedestals and electrostatic chucks may have local hot spots that can shift thermal kinetics or conditions of wafer processing. Two impactful causes of hot spots include inadequate heat spreading ability and inconsistent (or non-reproducible) placement of heater elements within the ceramic body of a chuck. Thicker ceramic bodies may spread heat more evenly, but the cost of raw material and processing to achieve this outcome is often prohibitive using current technology. An increased thermal mass can also reduce tool throughput. Placement reproducibility can be negatively impacted by a shifting of raw material powder during processing.

Furthermore, ceramic pedestals and electrostatic chucks are vulnerable to mechanical failure due to thermal stress. For example, ceramic pedestals and electrostatic chucks formed by hot-pressing may suffer from certain limitations inherent in such methods. In some instances, the total output of a hot-pressing operation may be constrained by the mass of a pre-formed body that is to be configured to fit into the dies of available hot presses. A hot-pressing operation may be further constrained by the density of the pre-form prior to sintering.

SUMMARY

In some examples, a substrate support assembly comprises a monolithic ceramic body, a heater element disposed within the monolithic ceramic body, an RF antenna disposed within the monolithic ceramic body, one or more power lines supplying the heater element and RF antenna, a lamellar structure formed or included within the monolithic ceramic body, the lamellar structure including at least one layer having a thermal conductivity different than a thermal conductivity of the monolithic ceramic body.

In some examples, the at least one layer is disposed above the heater element in use.

In some examples, the at least one layer is disposed below the heater element in use.

In some examples, the at least one layer includes a ceramic material.

In some examples, the at least one layer includes a metallic or intermetallic material.

In some examples, the lamellar structure includes at least two layers, wherein one of the at least two layers has a different thermal conductivity than at least one of the other layers in the lamellar structure.

In some examples, the thermal conductivity of at least one layer of the lamellar structure is different than the thermal conductivity of the monolithic ceramic body.

In some examples, the lamellar structure includes at least two layers, wherein each layer of the at least two layers has a different thermal conductivity than any other layer in the lamellar structure.

In some examples, the at least one layer of the lamellar structure includes a plate of pressureless-sintered aluminum nitride.

In some examples, the lamellar structure includes a mesh of silicon nitride (Si3N4) which, on formation or inclusion in the monolithic ceramic body, reacts with the material of the monolithic ceramic body.

Further examples are described in the Description below.

BRIEF DESCRIPTION OF THE DRAWINGS

Some embodiments are illustrated by way of example and not limitation in the figures of the accompanying drawings.

DESCRIPTION

Figure 1:
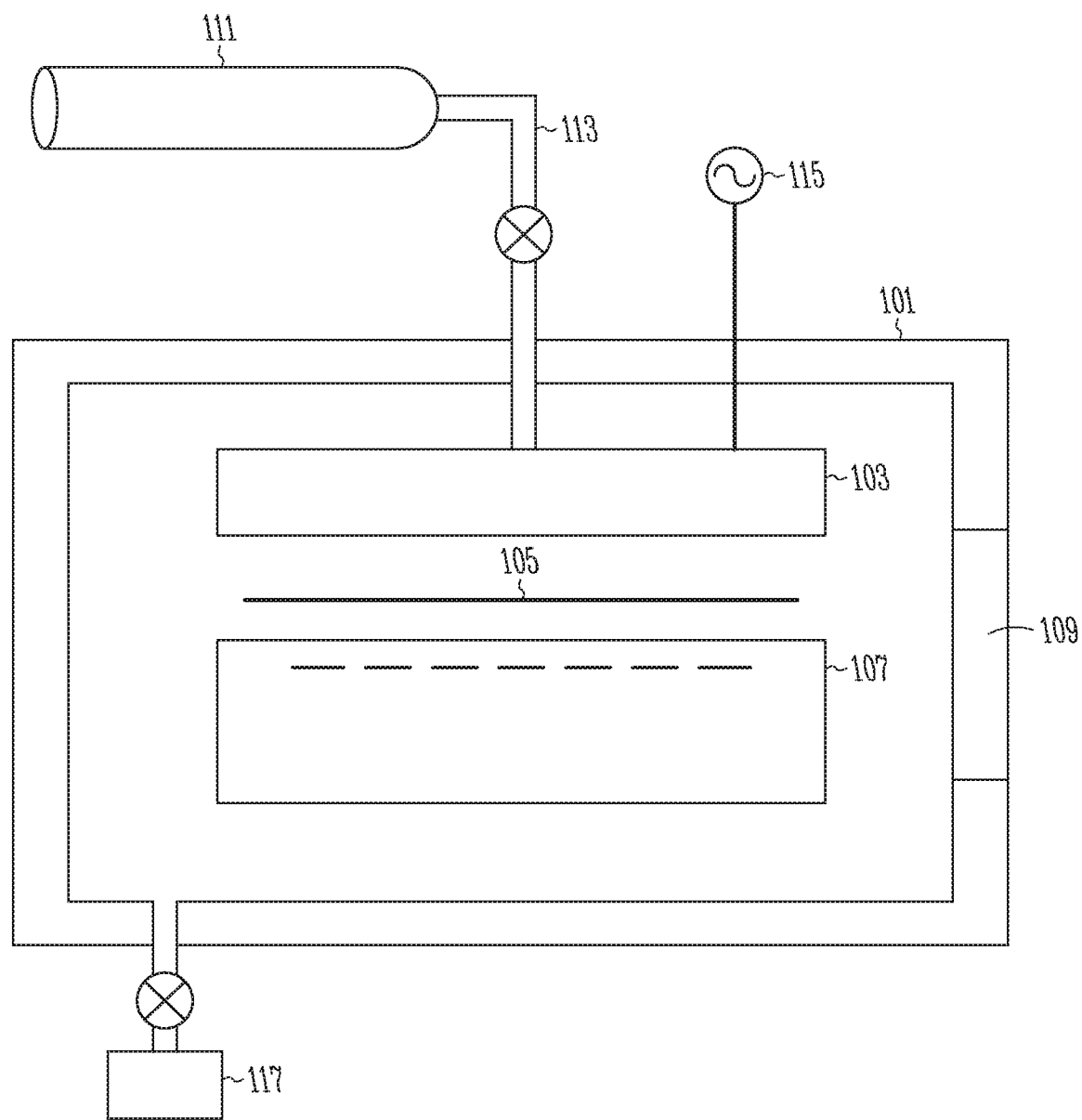
FIG. 1 shows a simplified example of a plasma-based processing chamber, which can include a substrate support assembly comprising an electrostatic chuck (ESC), for supporting a substrate during plasma processing.

The description that follows includes systems, methods, and techniques that embody illustrative embodiments of the present disclosure. In the following description, for purposes of explanation, numerous specific details are set forth in order to provide a thorough understanding of example embodiments. It will be evident, however, to one skilled in the art, that the present inventive subject matter may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Lam Research Corporation 2019-2020. All Rights Reserved.

With reference now to FIG. 1, an example of a plasma-based processing chamber is shown. The present subject matter may be used in a variety of semi-conductor manufacturing and wafer processing operations, but in the illustrated example the plasma-based processing chamber is described in the context of plasma-enhanced or radical-enhanced chemical vapor deposition (CVD) or atomic layer deposition (ALD) operations. The skilled artisan will also recognize that other types of ALD processing techniques are known (e.g., thermal-based ALD operations) and may incorporate a non-plasma-based processing chamber. An atomic layer deposition (ALD) tool is a specialized type of chemical vapor deposition (CVD) processing system in which ALD reactions occur between two or more chemical species. The two or more chemical species are referred to as precursor gases and are used to form a thin film deposition of a material on a substrate, such as a silicon wafer as used in the semiconductor industry. The precursor gases are sequentially introduced into an ALD processing chamber and react with a surface of the substrate to form a deposition layer. Generally, the substrate repeatedly interacts with the precursors to deposit slowly an increasingly thick layer of one or more material films on the substrate. In certain applications, multiple precursor gases may be used to form various types of film or films during a substrate manufacturing process.

FIG. 1 is shown to include a plasma-based processing chamber 101 in which a showerhead 103 (which may be a showerhead electrode) and a substrate support assembly 107 are disposed. The substrate support assembly 107 may include a pedestal such as is described in more detail below. Typically, the substrate support assembly 107 seeks to provide a substantially isothermal surface and may serve as both a heating element and a heat sink for a substrate 105. The substrate support assembly 107 may comprise an electrostatic chuck (ESC) in which heating elements are included to aid in processing the substrate 105, as described herein. The substrate 105 may include a wafer comprising elemental semiconductors (e.g., silicon or germanium), a wafer comprising compound elements (e.g., gallium arsenide (GaAs) or gallium nitride (GaN)), or variety of other substrate types (including conductive, semiconductive, and non-conductive substrates).

In operation, the substrate 105 is loaded through a loading port 109 onto the substrate support assembly 107. A gas line 113 can supply one or more process gases (e.g., precursor gases) to the showerhead 103. In turn, the showerhead 103 delivers the one or more process gases into the plasma-based processing chamber 101. A gas source 111 (e.g., one or more precursor gas ampules) to supply the one or more process gases is coupled to the gas line 113. In some examples, an RF power source 115 is coupled to the showerhead 103. In other examples, a power source is coupled to the substrate support assembly 107 or ESC.

Prior to entry into the showerhead 103 and downstream of the gas line 113, a point of use (POU) and manifold combination (not shown) controls entry of the one or more process gases into the plasma-based processing chamber 101. In the case of a plasma-based processing chamber 101 used to deposit thin films in a plasma-enhanced ALD (PEALD) operation, precursor gases may be mixed in the showerhead 103.

In operation, the plasma-based processing chamber 101 is evacuated by a vacuum pump 117. RF power is capacitively coupled between the showerhead 103 and a lower electrode (not shown explicitly) contained within or on the substrate support assembly 107. The substrate support assembly 107 is typically supplied with two or more RFs. For example, in various embodiments, the RFs may be selected from at least one frequency at about 1 MHz, 2 MHz, 13.56 MHz, 27 MHz, 60 MHz, and other frequencies as desired. A coil designed to block or partially block a particular RF can be designed as needed. Therefore, particular frequencies discussed herein are provided merely for ease in understanding. The RF power is used to energize the one or more process gases into a plasma in the space between the substrate 105 and the showerhead 103. The plasma can assist in depositing various layers (not shown) on the substrate 105. In other applications, the plasma can be used to etch device features into the various layers on the substrate 105. RF power is coupled through at least the substrate support assembly 107. The substrate support assembly 107 may have heaters (not shown in FIG. 1) incorporated therein. The detailed design of the plasma-based processing chamber 101 may vary.

Figure 2:
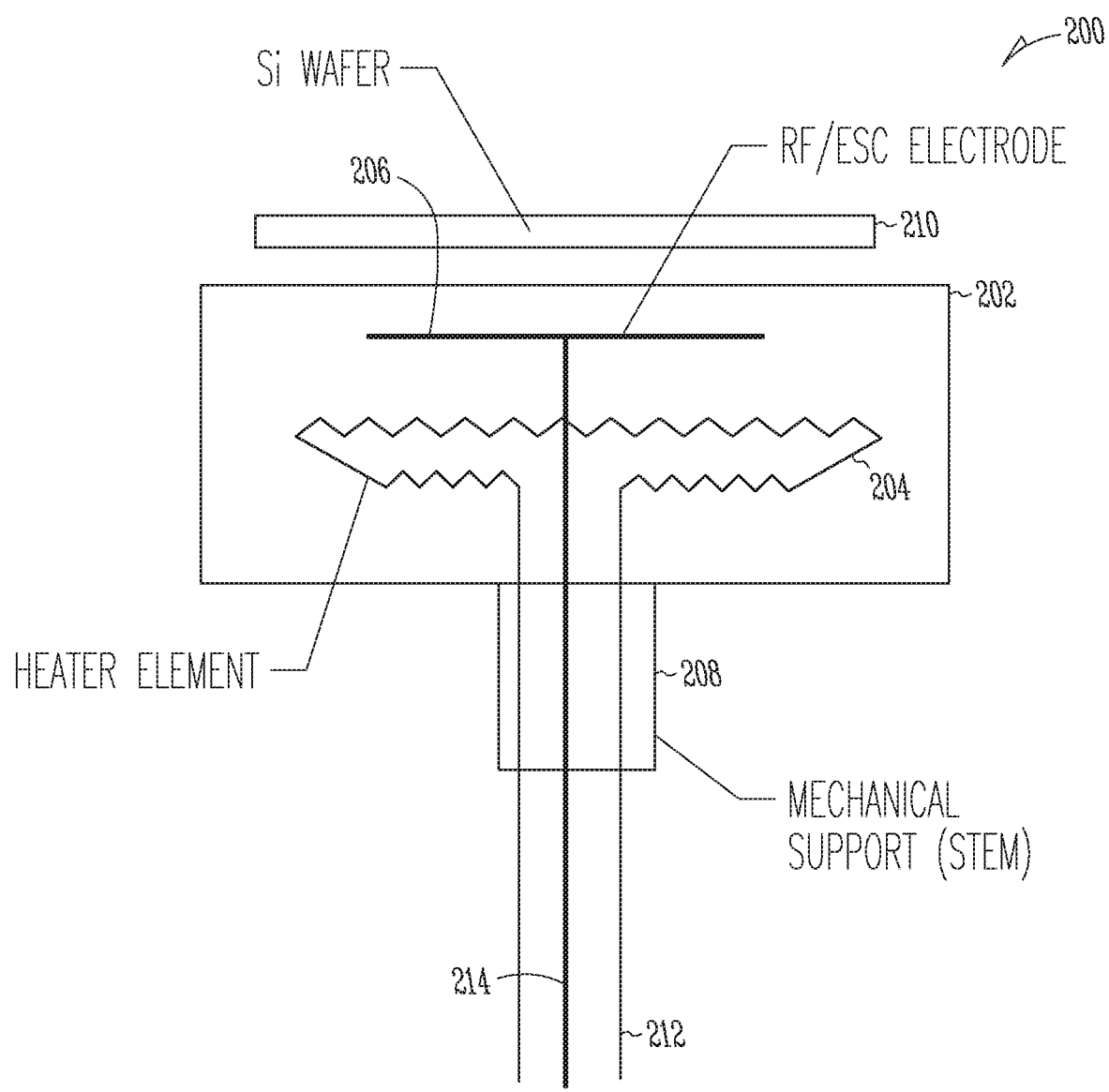
FIG. 2 shows aspects of a conventional substrate support assembly without a lamellar structure, according to an example.

Reference is now made to FIG. 2, which shows features of a simplified example of a conventional substrate support assembly (or pedestal) 200. The example substrate support assembly 200 does not include a lamellar structure of the present disclosure. This conventional example 200 will typically suffer from one or more of the limitations discussed above, including insufficient heat spreading and the formation of hot spots. The conventional substrate support assembly 200 includes a pedestal body 202 in which a heater element 204 is provided. The pedestal body 202 also includes an RF/ESC electrode 206. The pedestal body 202 is supported by a mechanical support, such as a stem 208. Lines 212 and 214 (such as power leads or conductors) that supply power to the heater element 204 and the RF/ESC electrode 206 respectively pass through the stem 208. During wafer processing, the substrate support assembly 200 supports a substrate 105, such as a silicon (Si) wafer 210.

To address at least some of the abovementioned challenges, some examples of the present disclosure include an anisotropic composite structure, for example a lamellar structure, formed within the body of a substrate support assembly 200. In some examples, the body of the substrate support assembly 200 includes a monolithic ceramic material or body. The lamellar structure within the monolithic ceramic body may include one or more layers of material having a relatively high or low thermal conductivity compared to the thermal conductivity of the ceramic material of the body of the substrate support assembly 200. In some examples, a layer of material having a relatively high thermal conductivity may enhance a flow of heat to a designated region of the ceramic body of the substrate support assembly 200, or other region of the substrate support assembly 200. In some examples, a layer of material having a relatively low thermal conductivity may retard the flow of heat to a designated region of the ceramic body of the substrate support assembly 200, or other region of the substrate support assembly 200. A homogenous or hybrid combination of layers of materials of differing thermal conductivity may be selected and provided within a ceramic body of a substrate support assembly 200. In some examples, a combination of layers of material allow an enhanced or inhibited spread of heat laterally or vertically within a predetermined thickness or portion of a ceramic body of a substrate support assembly 200.

In some examples, thermal conductivity may be defined as the quantity of heat that passes in unit time through unit area of a substance whose thickness is unity, when its opposite faces differ in temperature by one degree. The SI derived unit of thermal conductivity is watt per meter kelvin ($W \cdot m^{-1} \cdot K^{-1}$).

In some examples, a lamellar structure within a ceramic body of a substrate support assembly 200 includes stratified layers or components of relatively high thermal conductivity material extending in a lateral direction of the substrate support assembly 200 and layers (lamellae) of relatively lower thermal conductivity arranged in a vertical direction of the substrate support assembly 200.

In some examples, a lamellar structure within a ceramic body is formed in a sintering and hot-pressing operation. In some examples, one or more plates of relatively low thermal conductivity ceramic material are selected to form layers of a lamellar structure. The plates may be sintered, in some examples, to a fraction of the theoretical density of the ceramic body. The density level may be selected to optimize plate adhesion during hot pressing of the ceramic body of the substrate support assembly 200. In some examples, the plates are machined to a desired geometry and optionally provided with a surface treatment and/or coating that further improves plate adhesion within the ceramic body. In some examples, a lamellar structure is designed to allow heat to flow more readily or quickly in a longitudinal direction of each lamella, rather than flowing in a direction in which the lamellae are stacked.

In some examples, a pre-form (or "green structure") including a lamellar structure embedded within a ceramic body is formed. In some examples, at least one lamella in the lamellar structure is formed by sintering the powder of the pre-form. In some examples, the overall lamellar structure does not form until the entire ceramic body is sintered. The lamellar structure may include one or more layers constituted by or comprising a sintered metal or ceramic plate. A pre-form may include other internal structures or components of a ceramic pedestal or ESC, such as electrical circuitry for heater elements 204, RF electrodes 206, clamping electrodes, and so forth. The internal structures or components of the pre-form may be embedded in a compressed powder having a different composition to the ceramic body in which they are to be embedded. The compressed powder may be selected to enhance or retard thermal conductivity and/or adhesion of the internal structures or components.

In some examples, the pre-form is then hot pressed such that the various powders and plates therein bond together as the pre-form sinters to a value at or near a desired theoretical density. In some examples, one or more layers of the lamellar structure having selected thermal conductivity profiles may be constituted by or include another material such as a metal, or a structure such as a metallic mesh. These example materials or structures may be formed from or include a metallic sheet, a screen, a mesh, or formed by screen printing a metal or metallic layer onto the layer to form a composite structure.

In some examples, one or more layers of a lamellar structure may include a ceramic material and be arranged, for example, as described above and further include a coating. An example coating may include an additive or may have properties enhanced or modified by a chemical surface treatment that, for example, alters locally a thermal conductivity of the coating or a material to which the coating has been applied. In some examples, plates including high thermal conductivity material are coated with a substance or mix of substances chosen so as to reduce the thermal conductivity of its top and bottom surfaces during subsequent heat-treatment of the ceramic body. In some examples, a lamellar structure within a ceramic body includes three layers each, or in combination, having a thickness in the range 0.1 mm to 5 mm.

In some examples, a layer in the lamellar structure includes a plurality of sub-layers. The aggregate thickness the plurality of sub-layers equals or approximates a thickness of the layer. Top and bottom sub-layers in an arrangement of sub-layers may have a thickness that is either the diffusion distance (if a solid solution is formed for a central sub-layer) or may be controlled by an amount of coating added to a central sub-layer. The central, unreacted layer may have a thickness determined by the depth of the reaction that forms the top and bottom sub-layers.

In some examples, one or more layers of a lamellar structure may include a plate of a homogenous or solid material selected to react with or dissolve into the surrounding ceramic material of a ceramic body during sintering, thereby modifying its own or the ceramic body's thermal conductivity locally to achieve a desired heat transfer profile for a lamellar structure within the ceramic body. Conventionally, hot pressing removes voids and channels. In some examples, a pre-form structure or ceramic body is specifically created by other methods to form or include internal voids or channels therein. The intentional voids or channels may be provided on or adjacent specific layers of a lamellar structure and be configured to provide a desired heat transfer (thermal conductivity) profile. In some examples, a ceramic body may include a sintered in sacrificial layer that can be chemically etched away after all high-temperature processing is complete.

Some examples may address thermal conductivity issues relating to non-repeatable component placement. Some examples employ a datum or base structure by including, for example, a rigid sheet or platform of suitable material within a ceramic body of a substrate support assembly 200 (e.g. a pedestal) to constrain the relative position of other pedestal components during manufacturing of the ceramic body. The ceramic body may include, as a constrained component, a lamellar structure, according to one or more of the types described above.

In some examples, a pre-sintered plate or platform configured as a datum structure is situated within a ceramic body pre-form in close proximity to a plane of heater circuitry so as to reduce the influence of initial density variations within a ceramic body during sintering on the final location of a heating element of the heater circuitry.

In some examples, a datum structure includes a ceramic plate configured to accept a heater element 204 in a desired or fixed configuration only. The heater element 204 may be affixed to the ceramic plate using fasteners and/or an appropriate adhesive. In some examples, a sinterable pre-form may be affixed to the ceramic plate prior to placement in a die and may further be configured to constrain a location of the heating element during sintering.

Some examples herein may address a vulnerability of a substrate support assembly 200 or ceramic body including a lamellar structure to thermal stress. Here, in some examples, one or more structural elements (such as a plate, a hoop, a beam, or other suitable element) possessing desirable structural properties is placed within a pre-form, a lamellar structure, or a ceramic body to counteract anticipated thermal stresses that may occur at the surface or within the relevant pre-form, lamellar structure, or body. In some examples, one or more structural members within a pre-form, a lamellar structure, or a ceramic body have a greater coefficient of thermal expansion (CTE) than the bulk of the ceramic material in which they are provided. Tensile stress may be induced in the structural member by virtue of a difference between the fabrication temperature at which the structural member assumed its final shape, and the service temperature of the ceramic body, or a pedestal or ESC in which the structural member is used.

In some examples, a pre-form, a lamellar structure, or a ceramic body is heat-treated after sintering at a temperature at which high-CTE structural members embedded therein deform at a rate greater than the surrounding material in which they are placed (for example, via creep deformation). The higher deformation rate may relieve thermal stress within a lamellar structure, or a ceramic body pre-form and, in some examples, the relief is provided at a specific controlled or desired level.

In some examples, one or more different portions or parts of pre-form, a lamellar structure, or a ceramic body may be engineered to experience different rates of creep, such as through the use of selective heat treatment, alloying, doping, or other methods in order to control or produce a final stress profile. Some examples may include ceramic structural elements, for example as described above, coated in an additive or modified via a chemical surface treatment that locally alters a thermal expansion coefficient of material surrounding the structural element. The material of a structural element may be selected and added to a pre-form such that it reacts with or dissolves into surrounding ceramic material in a specified manner during sintering. The reaction or dissolution may modify a coefficient of thermal expansion and, in some examples, the added material may indeed constitute or be included in a structural member or layer of a lamellar structure within the surrounding bulk ceramic material.

Some examples herein may address issues relating to limited die space in hot pressing or, more generally, to the configuration of "furniture" (for example including dies, boats, crucibles, etc.) in high-temperature processing. Some examples include increasing an amount of ceramic material in a die prior to sintering and/or reducing a thickness of ceramic needed to achieve a given thermal uniformity specification. In some examples, one or more plates (e.g. to form one or more layers of a lamellar structure) of ceramic material are sintered at no applied pressure then added to one or more pre-forms. A conventional height of each pre-form may be reduced to render a minimized final volume of die material and this may allow a greater number of pre-forms to fit within a given die.

In some examples, a design of a substrate support assembly 200 (pedestal) is configured to take advantage of improved heat-spreading. For example, a wafer 210 may be placed closer to heating elements than conventionally without sacrificing thermal uniformity while allowing a thinner ceramic body to achieve the same or similar wafer processing performance. This approach may result in a savings of raw material and of hot press capacity.

Thus, in some examples, the incorporation of one or more plates or layers of distinct thermally conductive material into a substrate support structure (such as a ceramic pedestal, or monolithic ceramic body) can endow the substrate support assembly 200 with anisotropic thermal properties and allow improved heat spreading performance. The incorporation of such plates or layers may be performed prior to sintering of the ceramic body material in which they are placed. This approach may also allow the construction of pre-stressed ceramic bodies for pedestals that enjoy improved resistance to fractures. Some examples herein can be used to achieve greater control of internal structures within a ceramic body, and to increase throughput of systems that manufacture these pedestals.

Figure 3:
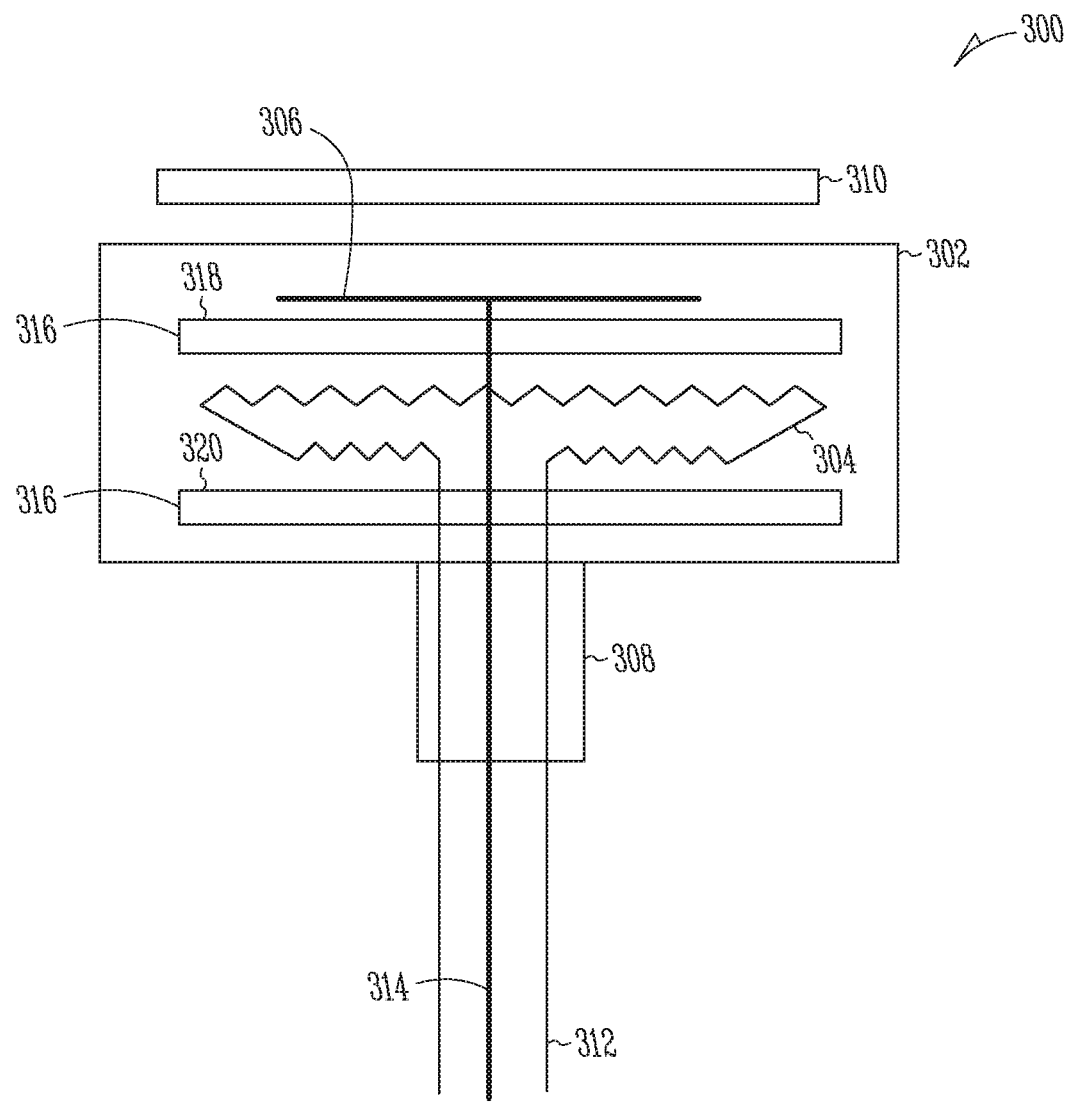
FIG. 3 shows aspects of an example substrate support assembly, according to an example of the present disclosure.

Reference is now made to FIG. 3, which shows aspects of an example substrate support assembly 300, in accordance with the present disclosure. The example substrate support assembly 300 includes an example lamellar structure 316 of the present disclosure. The example substrate support assembly 300 seeks to address one or more of the limitations discussed further above, including insufficient heat spreading and the formation of hot spots. The substrate support assembly 300 includes a pedestal body 302 in which a heater element 304 is provided. The pedestal body 302 may include or be constituted by a monolithic ceramic body. The pedestal body 302 also includes an RF/ESC electrode 306. The pedestal body 302 is supported by a mechanical support, such as a stem 308. Power lines 312 and 314 supply power to the heater element 304 and the RF/ESC electrode 206. In some examples, the lines 312 and 314 pass through the stem 208 as shown. During substrate processing, the substrate support assembly 300 supports a substrate 105, such as a silicon (Si) wafer 310.

In the illustrated example, the lamellar structure 316 includes two layers 318 and 320 disposed vertically one above the other in a stratified or lamellar arrangement. In some examples, the surrounding or adjacent ceramic material of the substrate support assembly 300 may be considered to constitute three additional layers disposed respectively: below, between, and above the layers 318 and 320. The lamellar structure 316 of this example would thus include five layers. Many other configurations of lamellar structure 316 are possible.

In some examples, each layer of the lamellar structure 316 may enhance or retard thermal conductivity in a direction along its length (i.e. laterally of the assembly 300 or horizontal in the view). In some examples, each vertically positioned layer of the lamellar structure 316 may have a different thermal conductivity to at least one other layer in the structure 316 so that a variable heat transfer profile is created in a vertical direction of the substrate support assembly 300, as well as in (or instead of) a lateral direction of the substrate support assembly 300.

In some examples, an upper layer 318 of the lamellar structure 316 includes a material of lower thermal conductivity than the surrounding ceramic material of the pedestal body 302. The reduced thermal conductivity may retard heat emitted from the heater element 304 from flowing directly upwards to the substrate 310. In some examples, the arrangement facilitates the emitted heat to flow laterally out towards colder regions of the pedestal body 302 supporting a substrate periphery, for example. Heat from the heater element 304 traveling on a path to the substrate 310 is retarded so it can spread laterally. In some examples, a lower layer 320 of the lamellar structure 316 may retard heat from the heater element 304 from flowing downwardly to the stem 308 and becoming lost as waste heat, for example. In some examples, potentially wasted heat is retained and enabled to spread relatively faster laterally within the support assembly 300 and then upwards to assist in substrate processing operations, for example.

Other layer configurations and materials may be selected for a lamellar structure 316 to provide desired heat transfer or thermal conductivity profiles within a pedestal body 302. For example, only one upper 318 or lower 320 layer may be provided. Some layers in a lamellar structure 316 may be disposed on one or both sides of a heater element 304. In some examples, the thermal conductivity and/or material of the upper layer 318, the lower layer 320, a side layer (not shown), and the ceramic material of the pedestal body 302 may each be different and selected to provide a given conductivity profile. The dimensions and specific placement of layers may be different and/or selected to provide a desired heat transfer or thermal conductivity profile for the pedestal body 302. For example, a lamellar structure 316 may include one or more plates of pressureless-sintered, low-thermal-conductivity aluminum nitride (AlN) placed into a ceramic pre-form and then sintered to form a ceramic pedestal body 302 with the one or more plates embedded therein and defining a lamellar structure 316. Another example lamellar structure 316 or ceramic pedestal body 302 may include an embedded mesh of silicon nitride ($Si_3N_4$) that reacts with surrounding material, for example aluminum nitride, to produce a layer of reduced thermal conductivity within a ceramic pedestal body 302.

In some examples, the heater element 304 may be provided in a heater zone. One or more heater zones may be provided within the pedestal body 302, in some examples. Each heater zone may include multiple heater elements 304. In some examples, an RF antenna 306 (such as a grid, or mesh) is provided within the pedestal body 302, as opposed to outside the pedestal body 302 in an external showerhead 103, for example. The internal placement of the RF antenna 306 as a thermally conductive element itself may assist in controlling a flow of heat within the pedestal body 302 or to the silicon wafer 310.

In some examples, one of more layers forming a lamellar structure 316 within a pedestal body 302 may each include homogenous (solid) or composite materials or components. The one or more layers may be provided in a continuous or discontinuous grid formation at varying elevations within a pedestal body 302, for example. A grid formation may (or may not) laterally or vertically surround a heater element 304 in a pedestal body 302. An offset dimension, in other words, a distance between a grid formation element or a layer 318 or 320 (for example) in a lamellar structure 316, and a heater element 304 may be selected to provide a desired heat transfer or thermal conductivity profile. An offset dimension may similarly be established with respect to an outer periphery or surface of the pedestal body 302.

In some examples, a thermal conductivity coefficient for a layer in a lamellar structure 316 may be in the range 5 to 200 W/m·K. In some examples, a thermal conductivity coefficient for lamellae 316 in pedestal body 302 may be in the range 75 to 00 W/m·K. In some examples, a thermal conductivity coefficient for a monolithic ceramic pedestal body 302 may be in the range 150 to 190 W/m·K.

In some examples, a stem 308 material includes the same material as a material included in a layer 318 or 320 within a pedestal body 302. In some examples, a layer 318 or 320 (or a part thereof) is provided at junction between the layer and the stem 308.

Outer dimensions of a solid or composite layer 318 or 320 within a lamellar structure 316 may be selected to conform with a given configuration or desired heat transfer characteristics of a pedestal or ceramic body. An outline shape or profile of a layer 318 or 320 in a lamellar structure 316 may include square, rectangular, or circular formations, or a combination of the same.

Specific layer materials may include metallic or intermetallic material. Layer materials may include aluminium nitride, silicon aluminium nitride, aluminium oxynitride, yttrium aluminate, magnesium aluminate, tungsten, molybdenum, copper, carbon, boron nitride, and composite structures composed of the above materials. Specific pedestal body materials may include aluminium nitride, aluminium oxynitride, aluminium oxide, silicon aluminium nitride, silicon aluminium oxynitride, yttrium aluminate, magnesium aluminate, and composite structures composed of the above materials.

Figure 4:
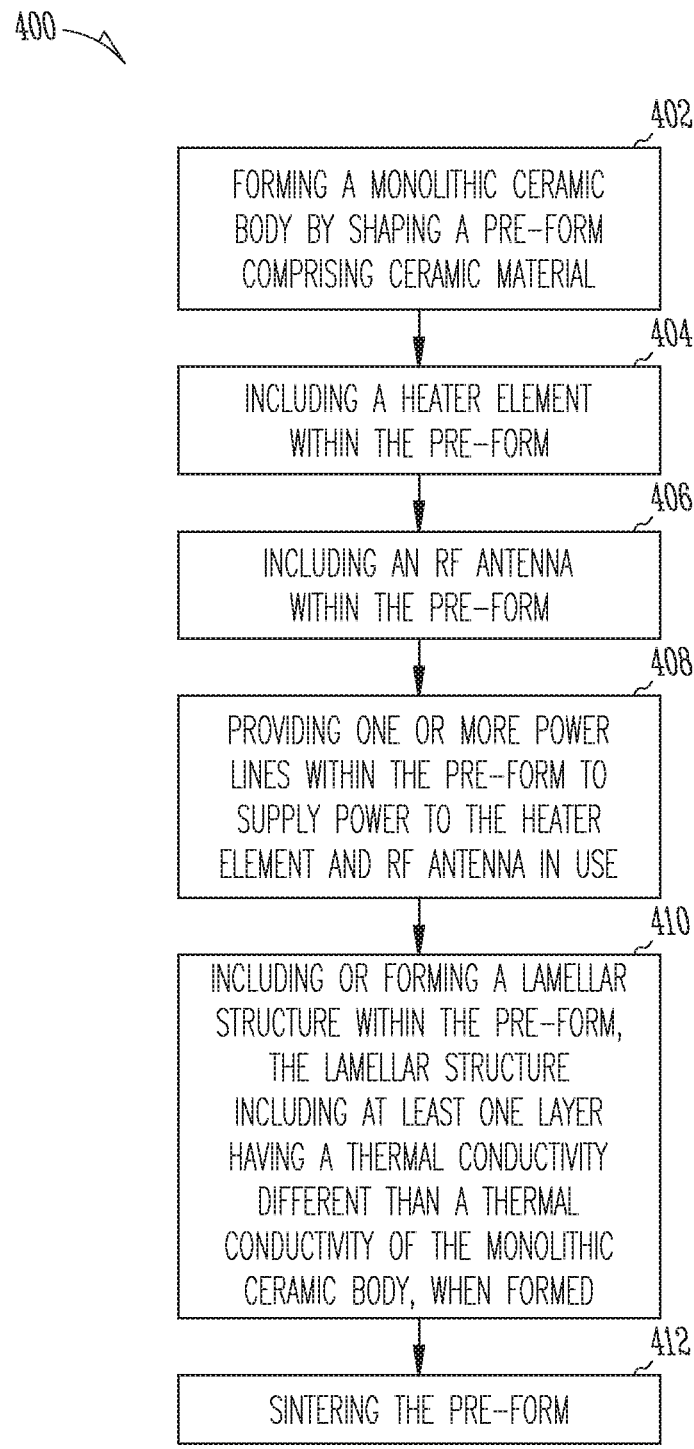
FIG. 4 shows a flow chart of example operations in a method, according to an example embodiment.

The present disclosure also includes example method embodiments. With reference to FIG. 4, a method 400 of forming a substrate support assembly 300 may include: at operation 402, forming a monolithic ceramic body by shaping a pre-form, the pre-form comprising ceramic material; at operation 404, including a heater element 304 within the pre-form; at operation 406, including an RF antenna 306 within the pre-form; at operation 408, providing one or more power lines 312, 314 within the pre-form to supply power to the heater element 304 and RF antenna 306 in use; at operation 410, including or forming a lamellar structure 316 within the pre-form, the lamellar structure 316 including at least one layer having a thermal conductivity different than a thermal conductivity of the monolithic ceramic body, when formed; and, at operation 412, sintering the pre-form.

In some examples, the method 400 may further comprise providing the at least one layer above the heater element 304 in the monolithic ceramic body.

In some examples, the method 400 may further comprise providing the at least one layer below the heater element 304 in the monolithic ceramic body.

In some examples, the method 400 may further comprise embedding or including a ceramic material in the at least one layer.

In some examples, the method 400 may further comprise including a metallic material in the at least one layer.

In some examples, the method 400 may further comprise including at least two layers in the lamellar structure 316 wherein one of the at least two layers has a different thermal conductivity than at least one of the other layers in the lamellar structure 316.

In some examples, the method 400 may further comprise including at least two layers in the lamellar structure 316 wherein each layer of the at least two layers has a different thermal conductivity than any other layer in the lamellar structure 316.

In some examples, the method 400 may further comprise including at least two layers in the lamellar structure 316 wherein the thermal conductivity of at least one layer of the lamellar structure 316 is different than the thermal conductivity of the monolithic ceramic body.

In some examples, the method 400 further comprises including a plate of pressureless-sintered aluminum nitride in the at least one layer of the lamellar structure 316.

In some examples, the method 400 further comprises including a mesh of silicon nitride (Si3N4) in the lamellar structure 316, the silicon nitride (Si3N4) reacting with the material of the monolithic ceramic body when the pre-form is sintered.

Although embodiments have been described with reference to specific examples, it will be evident that various modifications and changes may be made to these embodiments without departing from the broader scope of the disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A substrate support assembly comprising:
   a monolithic ceramic body;
   a heater element disposed within the monolithic ceramic body;
   an RF antenna disposed within the monolithic ceramic body;
   one or more power lines supplying the heater element and RF antenna; and
   a lamellar structure formed or included within the monolithic ceramic body, the lamellar structure including at least two layers wholly embedded therein, the at least two layers spaced apart from each other, wherein at least one of the two layers includes a ceramic material, the at least two layers including an upper layer disposed above the heater element, and a lower layer disposed below the heater element, respectively, and having a thermal conductivity different than a thermal conductivity of the monolithic ceramic body, wherein the RF antenna is disposed above the upper layer,
   wherein the upper layer and the lower layer partially encompass the heater element and extend continuously across and beyond the heater element, the upper layer and the lower layer spreading heat emitted from the heater element in a lateral direction of the substrate support assembly to create a desired lateral heat transfer profile.

2. The substrate support assembly of claim 1, wherein the at least two layers include a ceramic material.

3. The substrate support assembly of claim 1, wherein the at least two layers include a metallic or intermetallic material.

4. The substrate support assembly of claim 1, wherein each layer of the at least two layers has a different thermal conductivity than any other layer in the lamellar structure.

5. The substrate support assembly of claim 1, wherein the at least two layers of the lamellar structure includes plates of pressureless-sintered aluminum nitride.

6. The substrate support assembly of claim 1, wherein the lamellar structure includes a mesh of silicon nitride ($Si_3N_4$) which, on formation or inclusion in the monolithic ceramic body, reacts with a material of the monolithic ceramic body.

7. A method of forming a substrate support assembly, the method including:
   forming a monolithic ceramic body by shaping a pre-form, the pre-form comprising ceramic material;
   including a heater element within the pre-form;
   including an RF antenna within the pre-form;
   providing one or more power lines within the pre-form to supply power to the heater element and RF antenna in use;
   including or forming a lamellar structure within the pre-form, the lamellar structure including at least two layers wholly embedded therein, the at least two layers spaced apart from each other, wherein at least one of the two layers includes a ceramic material, the at least two layers including an upper layer disposed above the heater element, and a lower layer disposed below the heater element, respectively, and having a thermal conductivity different than a thermal conductivity of the monolithic ceramic body, when formed, wherein the RF antenna is disposed above the upper layer; and
   sintering the pre-form,
   wherein the upper layer and the lower layer partially encompass the heater element and extend continuously across and beyond the heater element to be capable of spreading heat emitted from the heater element in a lateral direction of the substrate support assembly to create a desired lateral beat transfer profile, and wherein one of the at least two lavers has a thermal conductivity different than at least one of other layers in the lamellar structure, the difference in the thermal conductivity of the at least two lavers facilitating spreading of the heat emitted from the heater element in a vertical direction of the substrate support assembly to create a desired vertical heat transfer profile.

8. The method of claim 7, further comprising embedding or including a ceramic material in the at least two layers.

9. The method of claim 7, further comprising including a metallic material in the at least two layers.

10. The method of claim 7, wherein each layer of the at least two layers has a different thermal conductivity than any other layer in the lamellar structure.

11. The method of claim 7, wherein the thermal conductivity of at least one layer of the lamellar structure is different than the thermal conductivity of the monolithic ceramic body.

12. The method of claim 7, further comprising including plates of pressureless-sintered aluminum nitride in the at least two layers of the lamellar structure.

13. The method of claim 7, further comprising including a mesh of silicon nitride ($Si_3N_4$) in the lamellar structure, the silicon nitride ($Si_3N_4$) reacting with a material of the monolithic ceramic body when the pre-form is sintered.

14. The substrate support assembly of claim 1, wherein the spreading of heat emitted from the heater element in the lateral direction prevents formation of hot spots.

15. The substrate support assembly of claim 1, wherein the upper layer retards the heat emitted from the heater element from flowing directly upwards to the substrate.

16. The substrate support assembly of claim 1, further comprising:
   a stem supporting the monolithic ceramic body, the stem being disposed below the lower layer.

17. The substrate support assembly of claim 16, wherein the lower layer retards the heat emitted from the heater element from flowing downwardly to the stem.

18. The substrate support assembly of claim 1, wherein at least one of the at least two layers includes a ceramic material includes a compressed powder having a different composition to the monolithic ceramic body.

19. The substrate support assembly of claim 1, wherein at least one of the two layers embedded in the monolithic ceramic body includes a homogenous or solid material that reacts with or dissolve into the ceramic material of the monolithic ceramic body during sintering.

20. The substrate support assembly of claim 1, wherein the monolithic ceramic body includes a pre-sintered ceramic plate positioned adjacent the heater element, the pre-sintered ceramic plate configured to constrain a position of the heater element and the lamellar structure during sintering.

21. The substrate support assembly of claim 1, wherein one of the at least two layers has a thermal conductivity different than another of the at least two layers in the lamellar structure.

\* \* \* \* \*